(12) United States Patent
Wann et al.

(10) Patent No.: US 10,032,889 B2
(45) Date of Patent: Jul. 24, 2018

(54) SELF-ALIGNED PASSIVATION OF ACTIVE REGIONS

(71) Applicant: Taiwan Semiconductor Manufacturing Company, Ltd., Hsin-Chu (TW)

(72) Inventors: Clement Hsingjen Wann, Carmel, NY (US); Ling-Yen Yeh, Hsin-Chu (TW); Chi-Yuan Shih, Hsin-Chu (TW); Wei-Chun Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/228,147

(22) Filed: Aug. 4, 2016

(65) Prior Publication Data

US 2016/0343832 A1    Nov. 24, 2016

Related U.S. Application Data

(63) Continuation of application No. 13/794,653, filed on Mar. 11, 2013, now Pat. No. 9,412,847.

(51) Int. Cl.
*H01L 31/0328* (2006.01)
*H01L 29/66* (2006.01)
(Continued)

(52) U.S. Cl.
CPC .... *H01L 29/66795* (2013.01); *H01L 21/0262* (2013.01); *H01L 21/02065* (2013.01);
(Continued)

(58) Field of Classification Search
None
See application file for complete search history.

(56) References Cited

U.S. PATENT DOCUMENTS

| 6,791,125 B2 * | 9/2004 | Demkov | ............... H01L 29/513 |
| | | | 257/192 |
| 7,141,456 B2 | 11/2006 | Lee et al. | |

(Continued)

FOREIGN PATENT DOCUMENTS

| KR | 20050002259 A | 1/2005 |
| KR | 20050080549 A | 8/2005 |

(Continued)

OTHER PUBLICATIONS

Kruger, Peter et al., "First-Principles Theory of Sulfur Adsorption on Semi-infinite Ge (001)," Physical Review Letters, vol. 64, No. 15, Apr. 1990, pp. 1808-1811.

(Continued)

*Primary Examiner* — Ali Naraghi
(74) *Attorney, Agent, or Firm* — Slater Matsil, LLP (57) ABSTRACT

A method includes forming a semiconductor fin, performing a first passivation step on a top surface of the semiconductor fin using a first passivation species, and performing a second passivation step on sidewalls of the semiconductor fin using a second passivation species different from the first passivation species. A gate stack is formed on a middle portion of the semiconductor fin. A source or a drain region is formed on a side of the gate stack, wherein the source or drain region and the gate stack form a Fin Field-Effect Transistor (FinFET).

20 Claims, 11 Drawing Sheets

(51) Int. Cl.
*H01L 29/78* (2006.01)
*H01L 21/02* (2006.01)
*H01L 21/306* (2006.01)
*H01L 21/762* (2006.01)

(52) U.S. Cl.
CPC .. *H01L 21/02129* (2013.01); *H01L 21/02381* (2013.01); *H01L 21/02631* (2013.01); *H01L 21/306* (2013.01); *H01L 21/76224* (2013.01); *H01L 29/66545* (2013.01); *H01L 29/7854* (2013.01)

(56) References Cited

U.S. PATENT DOCUMENTS

| | | | |
|---|---|---|---|
| 7,317,230 | B2 | 1/2008 | Lee et al. |
| 7,385,237 | B2 | 6/2008 | Lee et al. |
| 8,470,714 | B1 | 6/2013 | Tsai et al. |
| 8,748,280 | B2 | 6/2014 | Tang et al. |
| 8,941,155 | B2 | 1/2015 | Kang et al. |
| 2006/0163581 | A1 | 7/2006 | Suvkhanov |
| 2010/0105215 | A1* | 4/2010 | Sugawara ......... H01L 21/28176 438/771 |
| 2012/0034747 | A1 | 2/2012 | Lin |
| 2012/0211807 | A1 | 8/2012 | Yu et al. |
| 2013/0295738 | A1 | 11/2013 | Kuo et al. |

FOREIGN PATENT DOCUMENTS

| | | |
|---|---|---|
| KR | 20050091190 A | 9/2005 |
| KR | 20090042275 A | 4/2009 |

OTHER PUBLICATIONS

Sioncke, Sonja et al., "Passivation Challenges with Ge and III/V Devices," ECS transactions, May 2012, vol. 45, Issue 4, pp. 97-110.

Xue, Bai-Qing et al., "The Impact of HCl Precleaning and Sulfur Passivation on the Ai2O3/Ge Interface in Ge Metal-Oxide-Semiconductor Capacitors," Chin. Phys. Lett., vol. 29, No. 4, Apr. 2012, 4 pages.

Zurcher, Peter et al., "Photoemission determination of dipole layer and VBdiscontinuity formation during the MBE growth of GaAs on Ge(110)," JVSTA, Journal of Vacuum Science and Technology A, vol. 1, 695, http://dx.doi.org/10.1116/1.571980, Apr. 1983, 7 pages.

* cited by examiner

FIG. 13 ically grown a semiconductor material in trenches 16, and
SELF-ALIGNED PASSIVATION OF ACTIVE REGIONS

PRIORITY CLAIM AND CROSS-REFERENCE

This application is a continuation of U.S. patent application Ser. No. 13/794,653, entitled "Self-Aligned Passivation of Active Regions," filed on Mar. 11, 2013, which application is incorporated herein by reference.

BACKGROUND

With the increasing down-scaling of integrated circuits and increasingly demanding requirements to the speed of integrated circuits, transistors need to have higher drive currents with smaller dimensions. Fin Field-Effect Transistors (FinFETs) were thus developed. FinFETs have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased.

In an existing FinFET formation process, Shallow Trench Isolation (STI) regions are first formed in a silicon substrate. The portion of the silicon substrate between STI regions may be replaced with semiconductor materials such as silicon germanium, III-V compound semiconductor, or the like. The STI regions are then recessed to form semiconductor fins, which comprise portions of the semiconductor material that are over the recessed STI regions. Next, a gate dielectric, a gate electrode, and source and drain regions are formed to finish the formation of the FinFET.

The formation of the semiconductor fins includes a plurality of etching and cleaning processes. As a result, dangling bonds are generated on the surfaces of the semiconductor fins. The dangling bonds result in the increase in the Density of Interfacial States (Dit), and in turn results in the degradation in carrier mobility and the drive currents of the resulting FinFETs.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method of forming a Fin Field-Effect Transistor (FinFET) is provided in accordance with various embodiments. The intermediate stages of forming the FinFET are illustrated. The variations of the embodiments are discussed. Throughout the various views and illustrative embodiments, like reference numbers are used to designate like elements.

Figure 1:
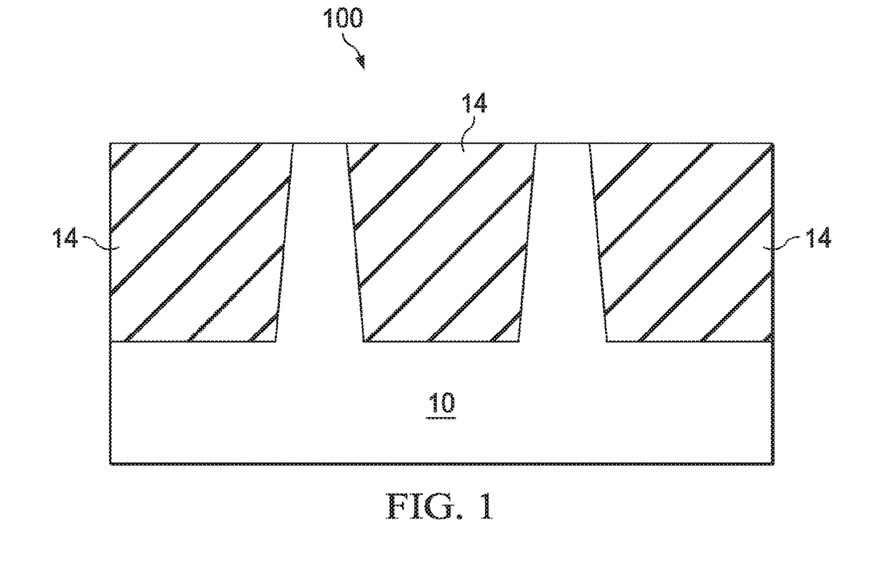
FIGS. 1 through 13 are cross-sectional views and perspective views of intermediate stages in the manufacturing of a Fin Field-Effect Transistor (FinFET) in accordance with some exemplary embodiments.

FIGS. 1 through 13 illustrate the cross-sectional views and perspective views of intermediate stages in the manufacturing of a FinFET. Referring to FIG. 1, substrate 10, which is a part of semiconductor wafer 100, is provided. Substrate 10 may be a silicon substrate, although it may also be formed of other materials such as germanium, SiC, SiGe, GaAs, sapphire, or the like. Insulation regions such as Shallow Trench Isolation (STI) regions 14 may be formed in substrate 10. Substrate 10 thus includes portions level with STI regions 14, and a portion under STI regions 14. The formation process of STI regions 14 may include etching substrate 10 to form recesses, filling the recesses with a dielectric material(s), and performing a planarization to remove excess dielectric materials. The remaining portions of the dielectric materials form STI regions 14.

Figure 2:
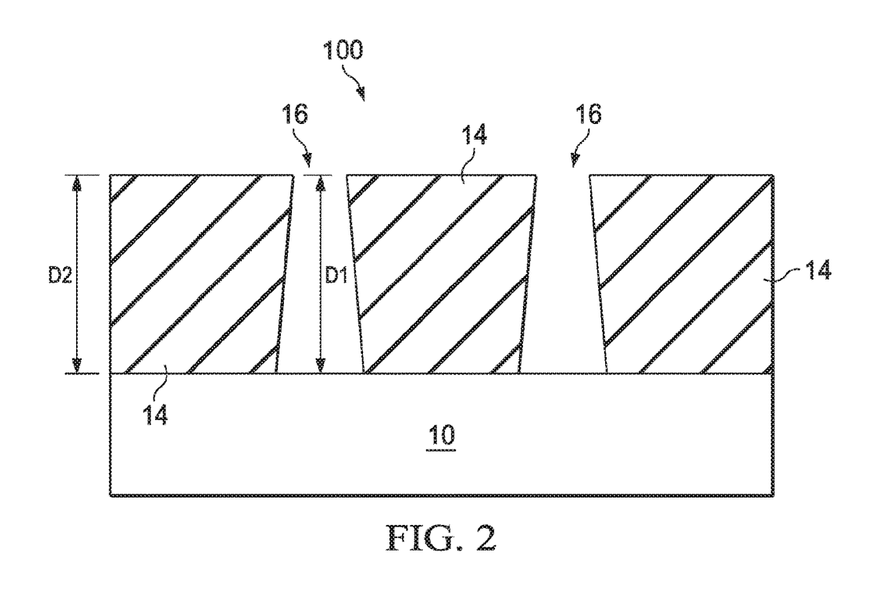

Next, as shown in FIG. 2, the portion of substrate 10 between opposite sidewalls of STI regions 14 is etched to form trenches 16. Depth D1 of trenches 16 may be substantially equal to or less than thickness D2 of STI regions 14. Depth D1 may be between about 50 nm and about 400 nm, for example. It is realized that the values recited throughout the description are merely examples, and may be changed to different values.

Figure 3:
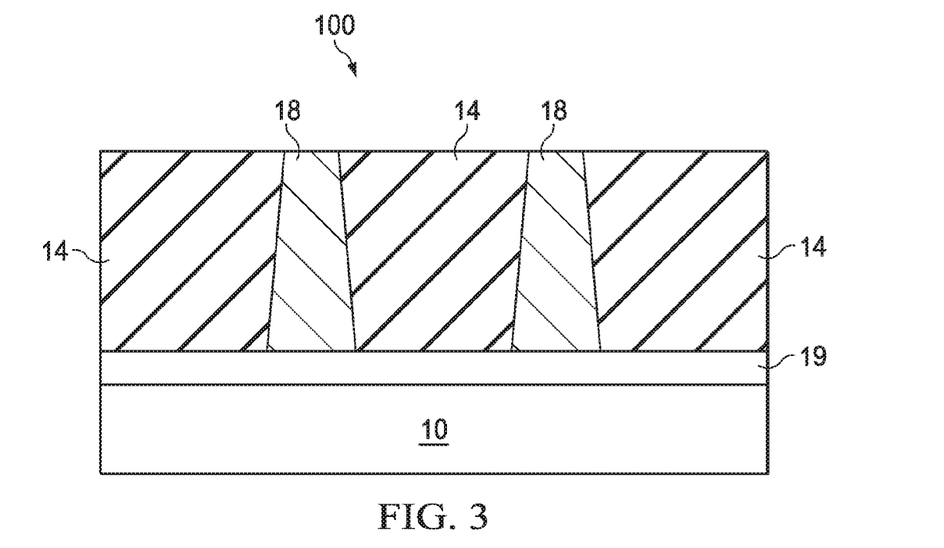

Referring to FIG. 3, semiconductor regions 18 are grown in trenches 16 (FIG. 2) through an epitaxial growth. The formation of semiconductor regions 18 may include epitaxially growing a semiconductor material in trenches 16, and then performing a Chemical Mechanical Polish (CMP) to level the top surfaces of STI regions 14 and the semiconductor material. In some embodiments, a buffer layer (not shown) may be grown on the exposed surfaces of substrate 10, followed by the growth of the remaining portions of semiconductor regions 18. The buffer layer may have a lattice constant between the lattice constant of substrate 10 and the lattice constants of the overlying portions of semiconductor regions 18. In some embodiments, semiconductor regions 18 are germanium-comprising regions comprising silicon germanium or pure germanium. Semiconductor regions 18 may also be graded, with the lower portions having lower germanium concentrations than the upper portions. In alternative embodiments, semiconductor regions 18 comprise III-V compound semiconductors. After the CMP, a cleaning step may be performed, for example, using a solution comprising diluted hydrogen fluoride (DHF), Standard Clean 1 (SC1, comprising NH4OH/H2O2/H2O) solution, Standard clean 2 (SC2, comprising HCl/H2O2/H2O) solution, and hence the residues and particles on the surfaces of semiconductor regions 18 and STI regions 14 are removed.

In some embodiments, a well doping is performed, for example, through an implantation step, and well region 19 is formed. Well region 19 extends into semiconductor fins 22, and at least top portions of semiconductor regions 18. Well region 19 may also extend into the portions of substrate 10 that are below the bottom surfaces of STI regions 14. If an n-type FinFET is to be formed, well region 19 may be a p-well region comprising a p-type impurity such as boron, indium, or the like. Otherwise, if a p-type FinFET is to be formed, well region 19 may be an n-well region comprising an n-type impurity such as phosphorous, arsenic, antimony, or the like. For clarity, in subsequent drawings, well region 19 is not illustrated.

Figure 4:
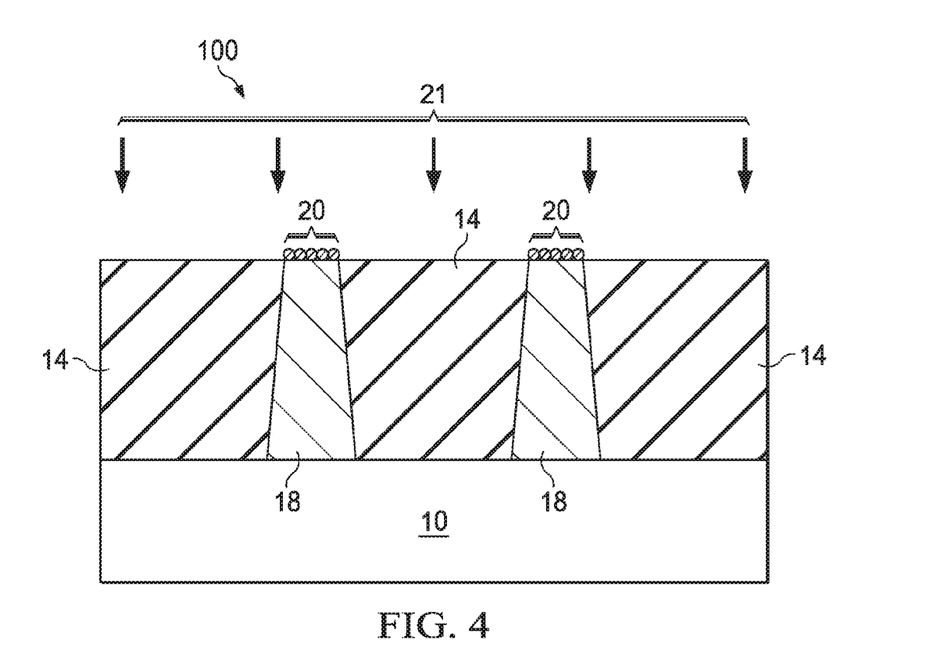

FIG. 4 illustrates a first passivation step. Before the passivation step, dangling bonds exist on the surfaces of semiconductor regions, which dangling bonds may be the dangling bonds of germanium, for example, depending on the material of semiconductor regions 18. During the passivation step, the dangling bonds are connected to the atoms of the elements (referred to as passivation species hereinafter) that are used for the passivation, and hence the dangling bonds are eliminated. The passivation species are represented by arrows 21.

In some embodiments, the top surfaces of semiconductor regions 18 have (001) (which is also referred to as (100)) surface planes. The respective surfaces are hence (001) or (100) surfaces. Accordingly, the passivation species that are suitable for the passivation of the (001) surface planes are selected. In some embodiments, the passivation species include sulfur (S), selenium (Se), or combinations thereof. The bonds formed between the dangling bonds and the passivation species are referred to as passivation bonds 20 hereinafter. Furthermore, passivation bonds 20 also represent the bonds that are formed between the passivation species that prefer, and is preferred by, (001) surfaces planes, as will be discussed in detail in subsequent paragraphs.

The passivation step may be performed for a period between about 1 second to tens of seconds, depending on the methods used for the passivation. In some embodiments, the passivation step comprises an ion implantation, in which the passivation species 21 are implanted, for example, using energies lower than about 10 keV, so that passivation species 21 are implanted shallow, or may be deposited on the top surface of semiconductor regions 18. After the implantation, an annealing may be performed to enhance the passivation efficiency, and possibly restore the lattice that is damaged in the implantation. In some embodiments, the annealing is performed at a temperature between about 400° C. and about 1,300° C., for example, for a time period between about 0.1 seconds to tens of minutes.

In alternative embodiments, the passivation step comprises plasma doping, wherein the passivation species 21 are doped on the surfaces of semiconductor regions 18. In the plasma doping, the plasma of the passivation species 21 are generated. When the passivation is performed through the implantation or the plasma doping, the passivation may be performed at room temperature (around 21° C.) or an elevated temperature, for example, between about 100° C. and about 500° C.

In yet other embodiments, the passivation step comprises a gas phase, wherein a process gas comprising passivation species 21 is introduced into a chamber in which the structure shown in FIG. 4 is placed. The dangling bonds are thus connected to the passivation species 21. In some exemplary embodiments, in the gas phase, H2S may be used as the process gas. In yet alternative embodiments, the passivation step comprises a liquid phase, wherein a liquid comprising passivation species 21 is applied on the structure shown in FIG. 3. For example, in the gas phase, (NH4)2S may be used as the liquid for the passivation.

Figure 5:
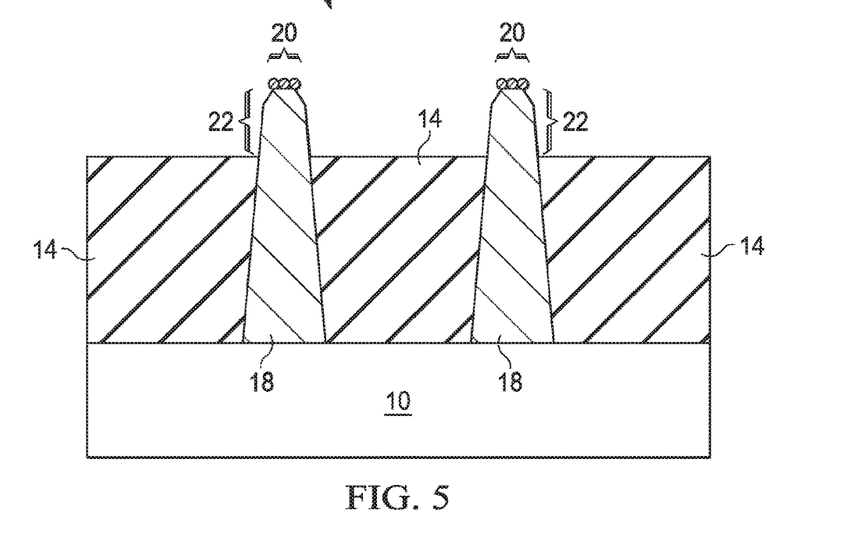

As a result of the passivation step, passivation bonds 20 are formed where dangling bonds are, and passivation bonds 20 are at the top surfaces of semiconductor regions 18. Due to the existence of STI regions 14, passivation bonds are not formed on the sidewalls of semiconductor regions 18. Next, as shown in FIG. 5, STI regions 14 are recessed. Portions of semiconductor regions 18 are thus higher than the top surfaces of the remaining portions of STI regions 14. These portions of semiconductor regions 18 are referred to as semiconductor fins 22 hereinafter. During the recessing, passivation bonds 20 are preserved.

Figure 6A:
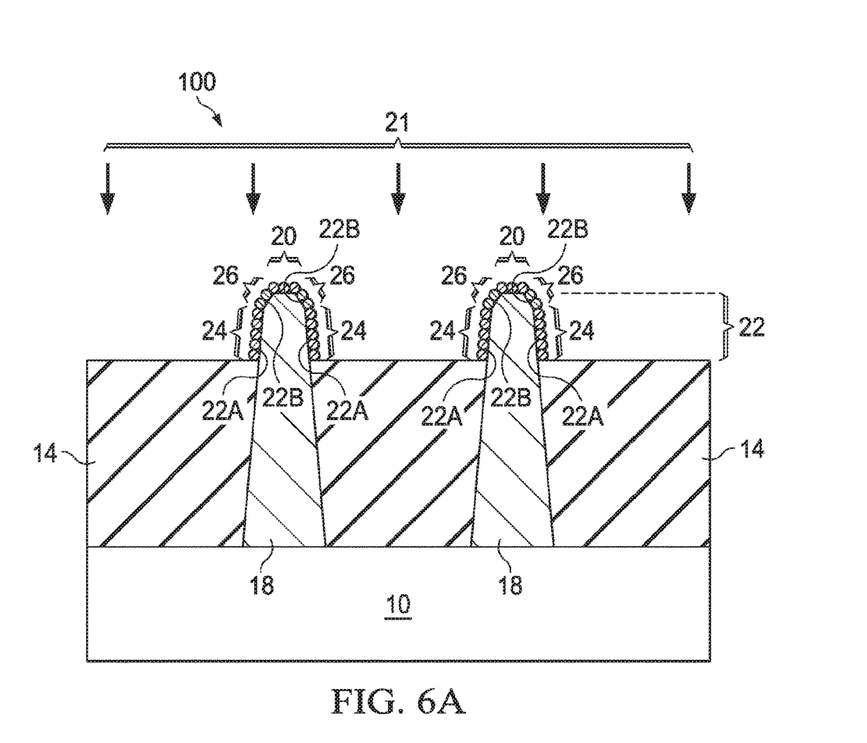

Referring to FIG. 6A, a second passivation step is performed using passivation species 21 to passivate the sidewalls of semiconductor fins 22, which are exposed due to the recess of STI regions 14. The sidewalls of semiconductor fins 22 may comprise (110) surfaces having (110) surface planes. The portions of sidewalls having the (110) surface planes are referred to as sidewalls 22A throughout the description. In addition, the sidewalls of semiconductor fins 22 may comprise (111) surfaces having (111) planes, which portions of sidewalls are referred to as sidewalls 22B. In some embodiments, the areas of the (110) surfaces are greater than the areas of the (111) surfaces. In the second passivation step, a passivation species that is suitable for the passivation of the (110) planes is included, which species may include antimony (Sb), S, arsenic (As), and combinations thereof.

In some embodiments, in addition to the species that is suitable for the passivation of the (110) planes, a species that is suitable for the passivation of the (111) planes is also included in the passivation species. The respective species include chlorine (Cl), As, and combinations thereof. In the embodiments wherein As and/or Cl is used, sulfur may also be added. The adding of sulfur is beneficial for the pinning at the conduction band. The methods for performing the second passivation may be selected from the same group of methods that may be used for the first passivation step. Accordingly, the details of the second passivation step are not repeated herein.

The passivation species may have their preferred surface planes for passivation, and each of the passivation species prefers to bond with the dangling bonds on certain surface planes, and do not prefer to bond with the dangling bonds on some other surface planes. For example, S and Se prefer, and are preferred by, (001) (or (100)) surface planes, Sb, S, and As prefer, and are preferred by, (110) surface planes, and As and Cl prefer, and are preferred by, (111) surface planes. Therefore, even if a plurality of different passivation species is provided simultaneously in a passivation step, the species will selectively form passivation bonds with the dangling bonds of their preferred planes, while the number of passivation bonds formed with the non-preferred planes, if any, is much fewer. Accordingly, in accordance with exemplary embodiments, in the second passivation step, by providing species that prefer (110) planes and (111) planes simultaneously, the (110) planes and (111) planes may obtain their preferred bonding species, and form the respective passivation bonds 24 and 26, as illustrated in FIG. 6A. In these embodiments, bonds 24 represent the passivation bonds formed with the passivation species (such as Sb, S, and As) that prefer (110) surfaces, and bonds 26 represent the passivation bonds formed with the passivation species (such as As, and Cl) that prefer (111) surfaces.

Figure 6B:
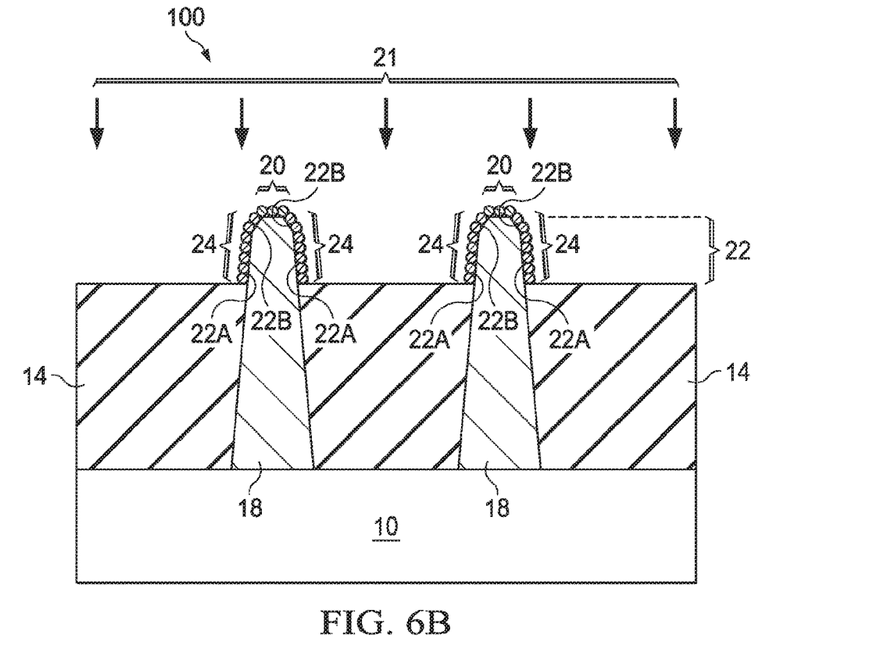

In alternative embodiments, as shown in FIG. 6B, in the second passivation step, species that is suitable for the passivation of the (111) planes is not used, while the passivation species includes what is suitable for the passivation of the (110) planes. Accordingly, if the sidewalls of semiconductor fins 22 comprises (111) surface plane, the (111) planes may be terminated by the species that prefer (110) planes, which species may include Sb and/or As, to form passivation bonds 24, while no passivation bonds 26 are formed.

Figure 7:
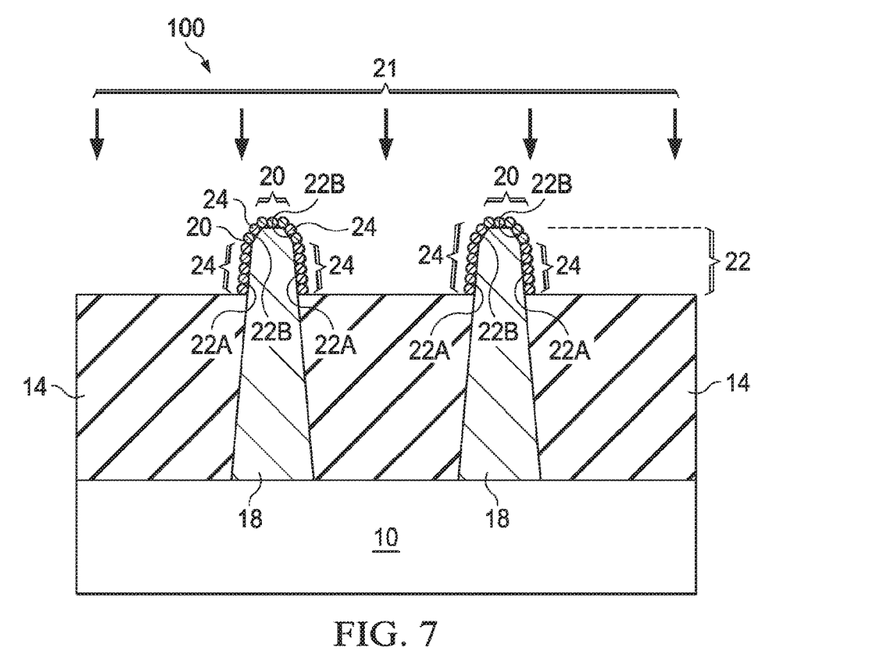

FIG. 7 illustrates a structure formed in accordance with alternative embodiments. In these embodiments, the first passivation step as shown in FIG. 4 is skipped. Instead, after fins 22 are formed, the top surface and the sidewalls of fins 22 are passivated at the same time. Accordingly, the respective passivation species include the species that is suitable for the passivation of the (001) planes and the species that is suitable for the passivation of the (110) planes. The passivation species may, or may not, include species that is suitable for the passivation of the (111) planes. When the species that is suitable for the passivation of the (111) planes are included, the respective passivation bonds are similar to what are shown in FIG. 6A, wherein passivation bonds 20, 24, and 26 are formed on the (001) surfaces, (110) surfaces, and (111) surfaces, respectively. Otherwise, when the species that is suitable for the passivation of the (111) planes are not included, the respective passivation bonds are similar to what is shown in FIG. 7, in which passivation bonds 20 and 24 are formed on the (001) surfaces and (110) surfaces, respectively. The (111) surfaces 22B, however, may have either one or both of passivation bonds 20 or 24 formed thereon.

Figure 8:
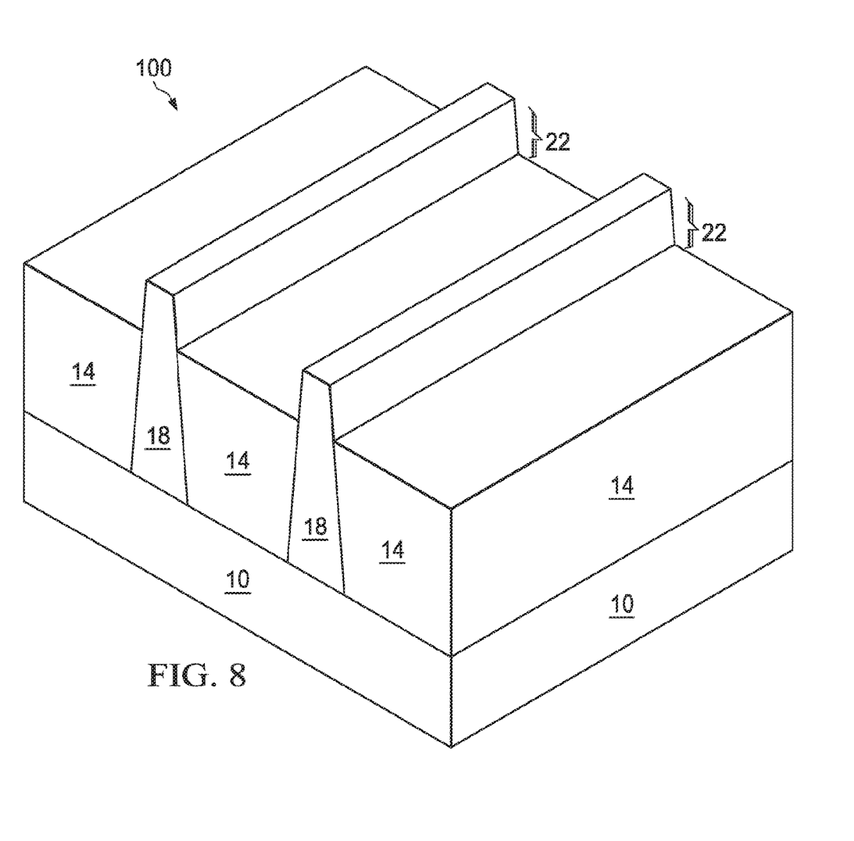
Figure 9:
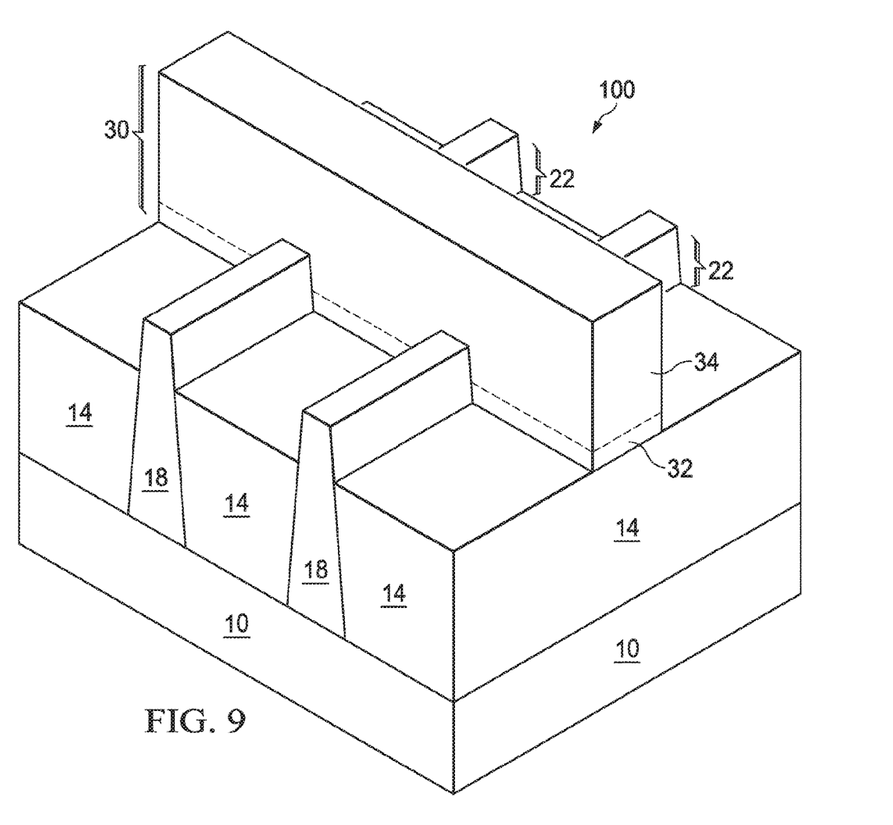

FIG. 8 illustrates a perspective view of the structure in FIGS. 6A, 6B, and 7. The passivation bonds formed in preceding process steps are not illustrated, and may be found referring to FIGS. 6A, 6B, and 7. Next, as shown in FIG. 9, gate stack 30 is formed. Gate stack 30 covers the middle portions of semiconductor fins 22, and leaves the end portions of semiconductor fins 22 uncovered. Furthermore, gate stack 30 is formed on the sidewalls and the top surfaces of the middle portions of semiconductor fins 22.

In some embodiments, gate stack 30 forms a dummy gate stack that will be replaced by a replacement gate in subsequent steps. Accordingly, gate stack 30 may include a dummy gate electrode (which is also denoted as 34), which may comprise polysilicon, for example. Dummy gate dielectric 32 may, or may not, be formed between dummy gate electrode 34 and semiconductor fins 22. Gate spacers (not shown) may be formed as parts of gate stack 30 in these embodiments. In alternative embodiments, gate spacers are not formed.

In alternative embodiments, gate stack 30 remains in the final FinFET, and forms the gate stack of the final FinFET. Gate dielectric 32 may be selected from silicon oxide, silicon nitride, gallium oxide, aluminum oxide, scandium oxide, zirconium oxide, lanthanum oxide, hafnium oxide, combinations thereof, and multi-layers thereof. Gate electrode 34 may include a conductive material that includes polysilicon, a refractory metal or the respective compound including, e.g., titanium (Ti), titanium nitride (TiN), titanium tungsten (TiW), and tungsten (W). In other examples, gate electrode 34 includes nickel (Ni), gold (Au), copper (Cu), or the alloys thereof.

Figure 10:
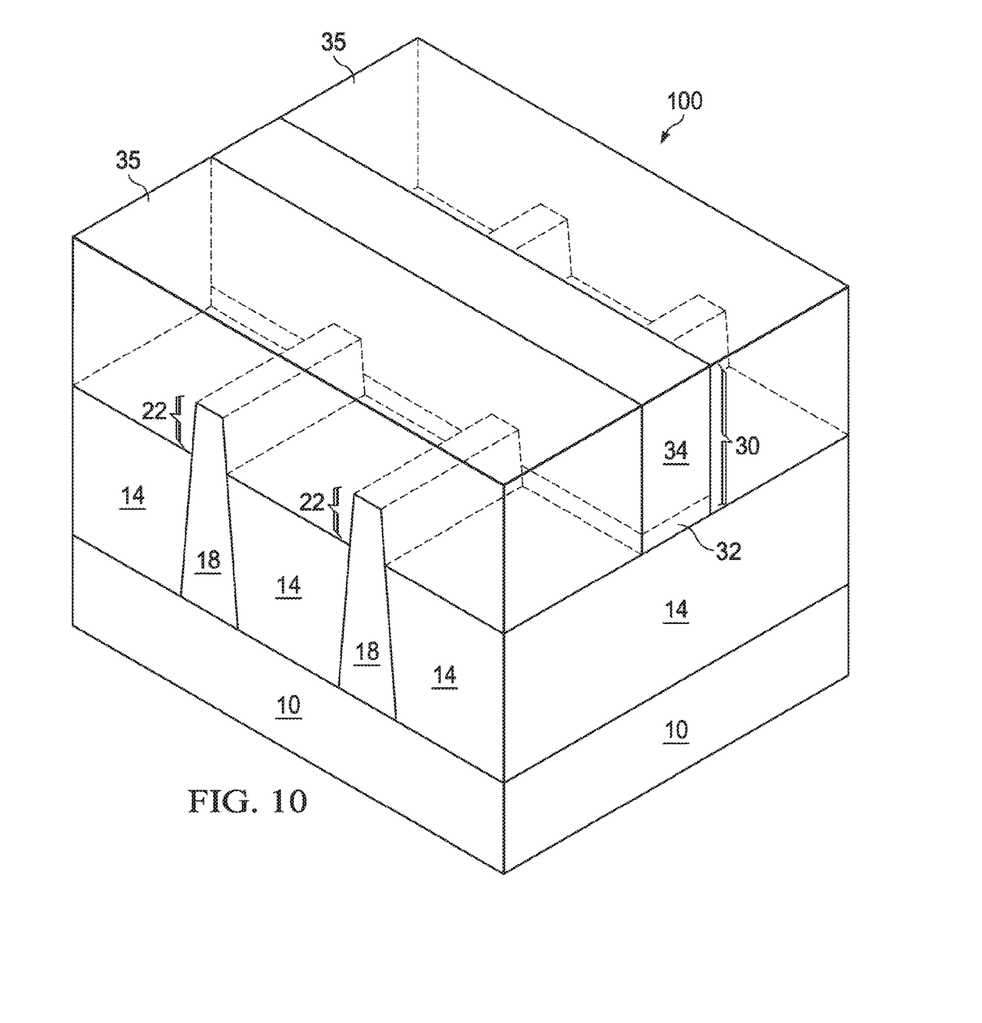

FIG. 10 illustrates a perspective view of the structure after Inter-Layer Dielectric (ILD) 35 is formed. ILD 35 is formed of a dielectric material such as Phospho-Silicate Glass (PSG), Boro-Silicate Glass (BSG), Boron-Doped Phospho-Silicate Glass (BPSG), or the like. A CMP may be performed to level the top surface of ILD 35 with the top surface of gate stack 30. Accordingly, the end portions of semiconductor fins 22 are buried under ILD 35. Although not shown, before the formation of ILD 35, spacers may be formed on the opposite sidewalls of gate stack 30, wherein the spacers may be formed of a material different from the materials of ILD 35 and gate stack 30.

Figure 11A:
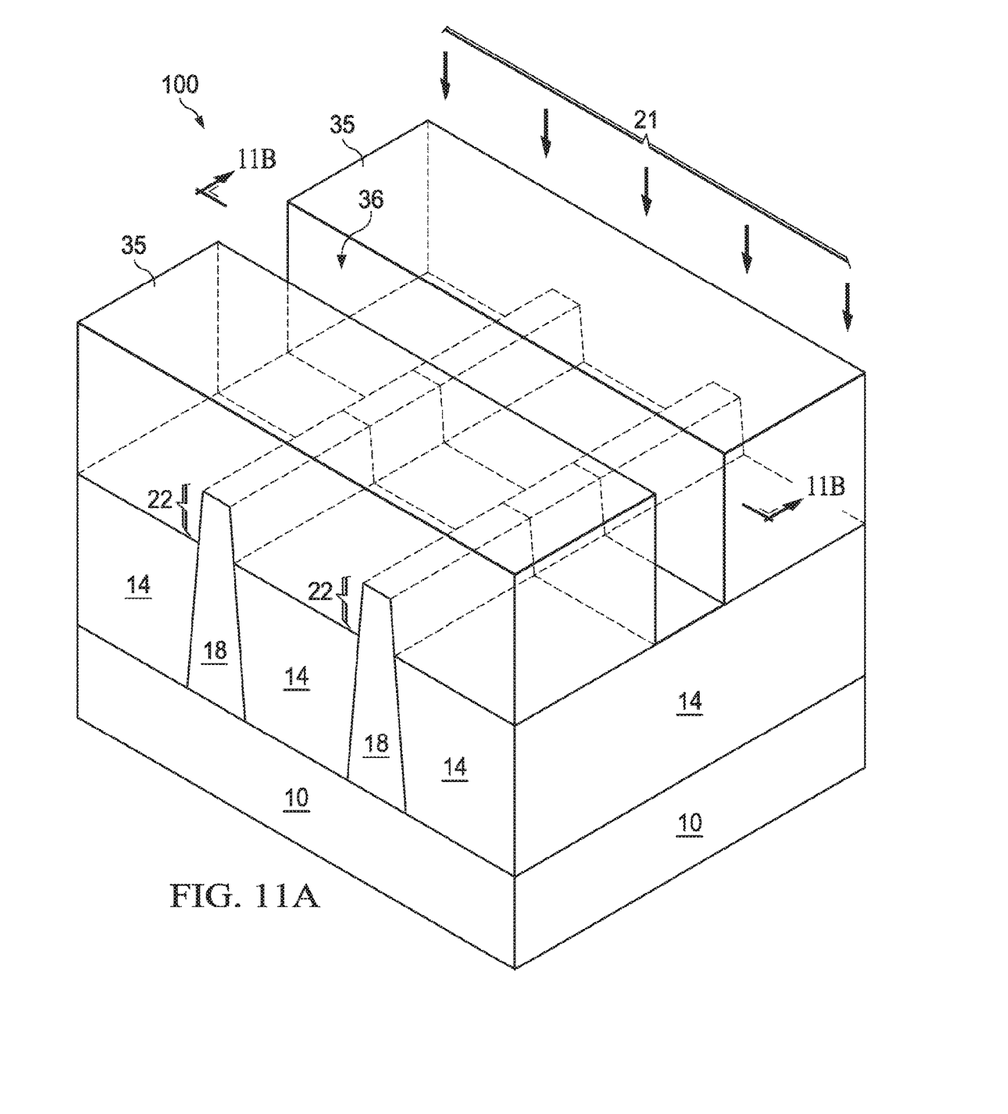
Figure 11B:
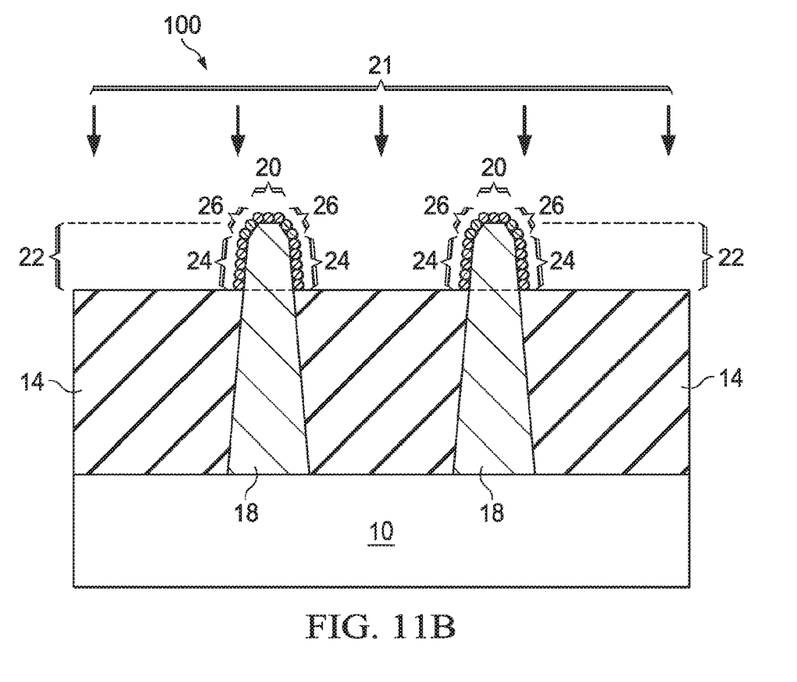

Next, referring to FIG. 11A, dummy gate stack 30 is removed in an etching step, so that recess 36 is formed in ILD 35. In some embodiments, a further passivation step is performed on the exposed portions of semiconductor fins 22, as shown in FIG. 11B. In alternative embodiments, no further passivation step is performed. FIG. 11A illustrates a perspective view, and FIG. 11B illustrates the cross-sectional view obtained from the planes crossing lines 11B-11B in FIG. 11A. As shown in FIG. 11B, passivation species 21 are introduced to passivate the top surfaces and sidewalls of the middle portions of semiconductor fins 22. In these embodiments, the end portions of semiconductor fins 22 are covered by ILD 35, and hence are not passivated. Passivation species 21 include the species that is suitable for the passivation of the (001) planes, and/or the species that is suitable for the passivation of the (110) planes. Passivation species 21 may, or may not, include species that is suitable for the passivation of the (111) planes. The passivation may be performed using a method selected from the same group of methods that may be used for the first passivation step, and hence is not repeated herein.

Figure 12A:
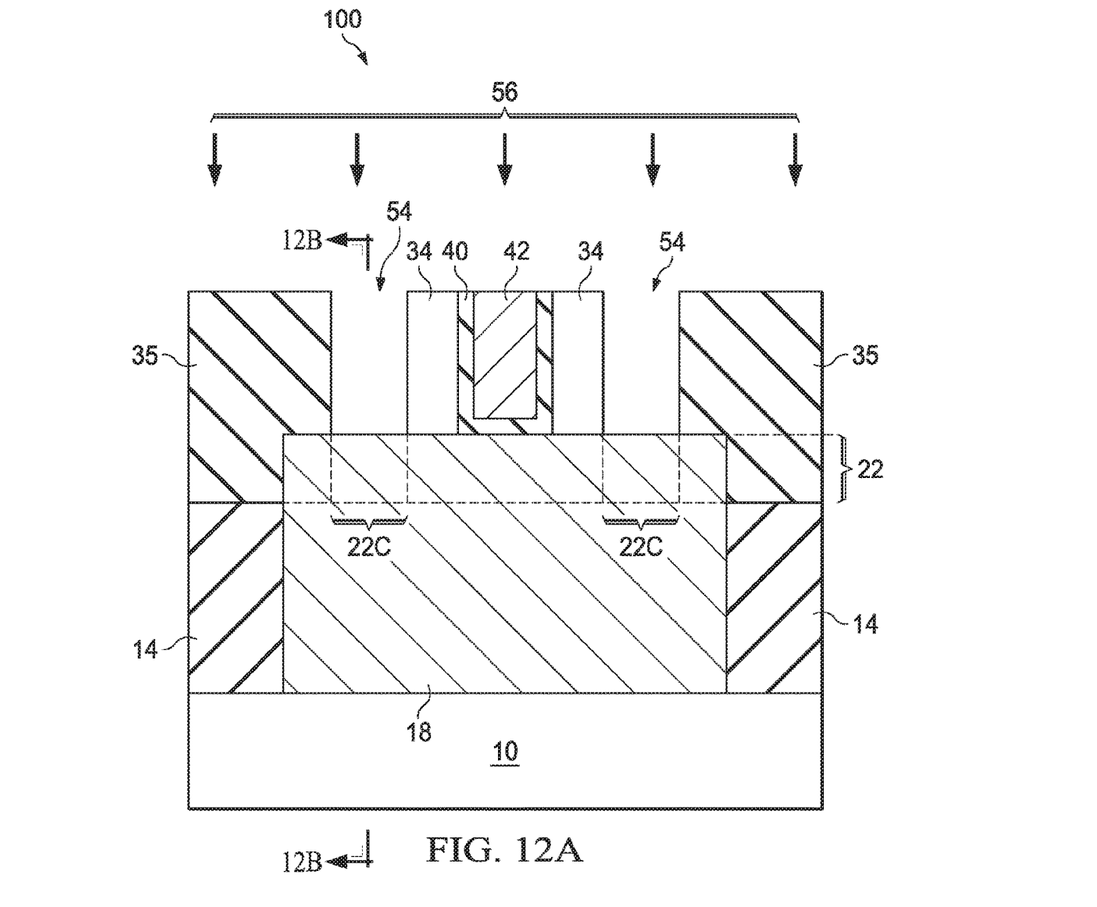
Figure 12B:
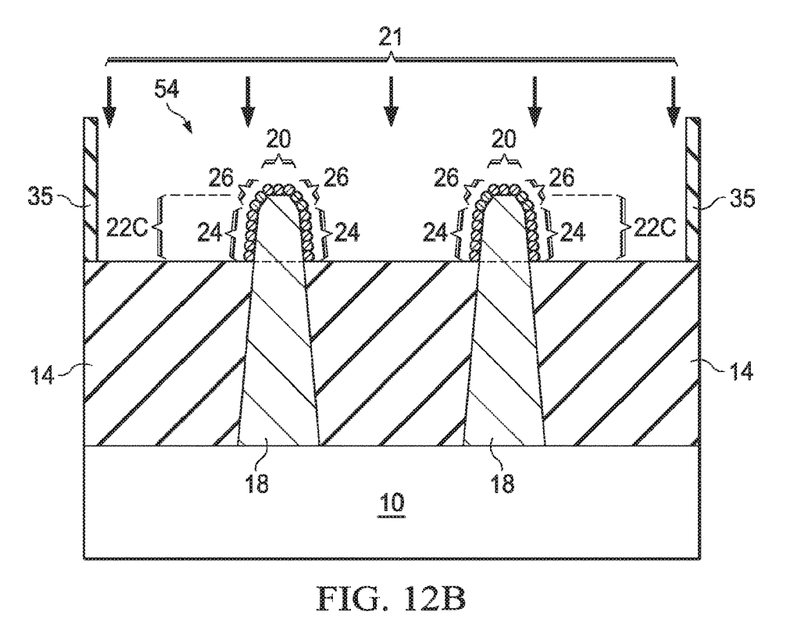

FIGS. 12A and 12B illustrate the formation of gate dielectric layer 40 and gate electrode 42, which form the replacement gate of the resulting FinFET. FIGS. 12A and 12B further illustrate the formation of contact openings 54, through which some end portions 22C of semiconductor fins 22 are exposed. FIGS. 12A and 12B further illustrate the further passivation of the end portions 22C. The cross-sectional view in FIG. 12B is obtained from the same plane that crosses lines 12B-12B in FIG. 12A. In the formation of the replacement gate, gate dielectric layer 40 is formed in recess 36 (FIG. 11A) as a blanket layer. Gate dielectric layer 40 is also on the top surfaces and the sidewalls of the middle portions of semiconductor fins 22. In accordance with some embodiments, gate dielectric layer 40 comprises silicon oxide, silicon nitride, or multilayers thereof. In alternative embodiments, gate dielectric layer 40 comprises a high-k dielectric material, and hence is alternatively referred to as high-k gate dielectric layer 40 throughout the description. High-k gate dielectric layer 40 may have a k value greater than about 7.0, and may include a metal oxide of Hf, Al, Zr, La, Mg, Ba, Ti, Pb, and combinations thereof. The formation methods of gate dielectric layer 40 may include Molecular-Beam Deposition (MBD), Atomic Layer Deposition (ALD), Physical Vapor Deposition (PVD), and the like.

Next, conductive material 42 is formed over gate dielectric layer 40, and fills the remaining recess 36 (FIG. 11A). Conductive material 42 may comprise a metal-containing material such as TiN, TaN, TaC, Co, Ru, Al, combinations thereof, and multi-layers thereof. After the filling of conductive material 42, a CMP is performed to remove the excess portions of gate dielectric layer 40 and conductive material 42 over the top surface of ILD 35. The resulting remaining portions of the conductive material 42 and gate dielectric layer 40 thus form the replacement gate, which includes gate electrode 42 and gate dielectric 40, respectively.

As shown in FIG. 12B, passivation species 21 are introduced to passivate the top surfaces and sidewalls of end portions 22C of semiconductor fins 22. In these embodiments, the middle portions of semiconductor fins 22 are covered by the replacement gate, and hence are not passivated. Passivation species 21 include the species that is suitable for the passivation of the (001) planes and/or the species that is suitable for the passivation of the (110) planes. The passivation species 21 may, or may not, include species that is suitable for the passivation of the (111) planes. The method for performing the passivation may be selected from the same group of methods that may be used for the first passivation step, and hence are not repeated herein. As a result of the passivation, passivation bonds 20, 24, and/or 26 are formed, depending on the passivation species used.

Figure 13:
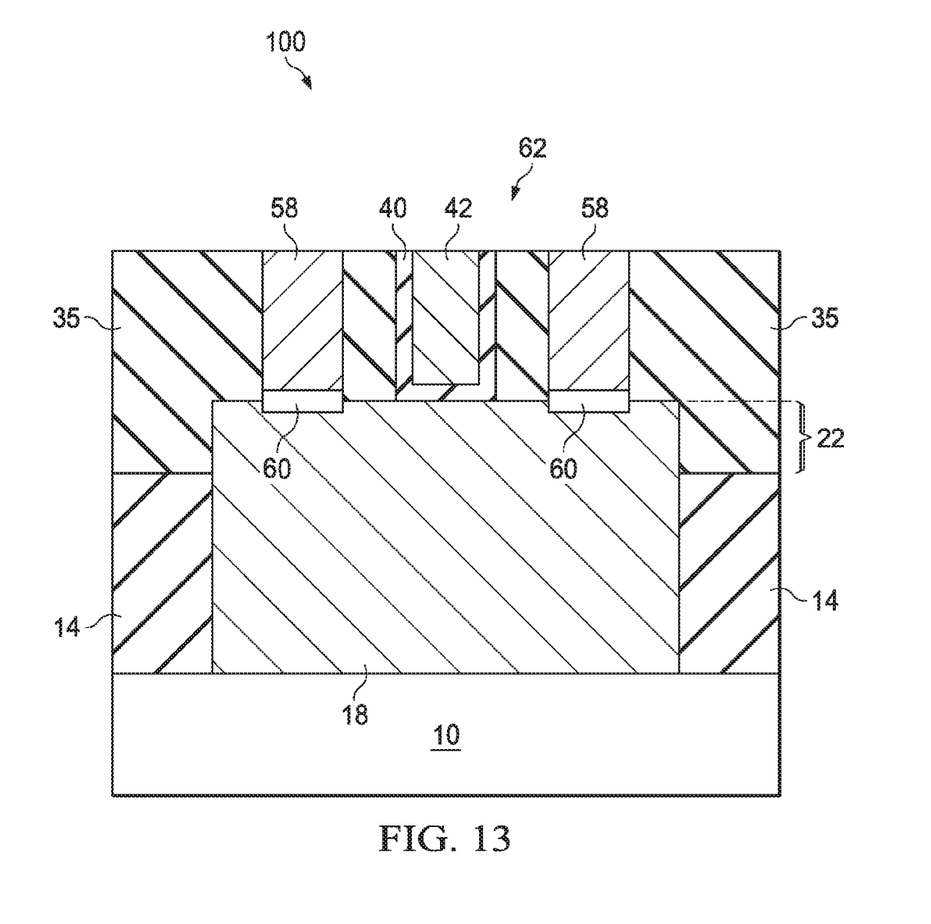

FIG. 13 illustrates the formation of source and drain silicide regions 60 and contact plugs 58, which are formed in contact openings 54 in FIG. 12A. The formation of FinFET 62 is thus finished.

Throughout the description, a plurality of passivation steps is performed at different stages in the formation of FinFET 62. The formation of FinFET 62, however, may include one or more, but not all, of the described passivation steps in any combination.

In the embodiments, through the passivation of semiconductor fins, the Density of Interfacial States (Dit) at the surfaces of the semiconductor fins is reduced, and the performance of the resulting FinFET 62 is improved. By using different passivation species to eliminate the dangle bonds of different planes, the efficiency of the passivation process is improved.

In accordance with some embodiments, a method includes forming a semiconductor fin, performing a first passivation step on a top surface of the semiconductor fin using a first passivation species, and performing a second passivation step on sidewalls of the semiconductor fin using a second passivation species different from the first passivation species. A gate stack is formed on a middle portion of the semiconductor fin. A source or a drain region is formed on a side of the gate stack, wherein the source or drain region and the gate stack form a FinFET.

In accordance with other embodiments, a method includes performing a first passivation step on a top surface of a semiconductor region using a first passivation species. The semiconductor region is between isolation regions, with the top surface of the semiconductor region level with top surfaces of the isolation regions. After the first passivation step, the isolation regions are recessed, wherein a top portion of the semiconductor region higher than top surfaces of remaining portions of the isolation regions forms a semiconductor fin. After the step of recessing, a second passivation step is performed on the semiconductor fin using a second passivation species different from the first passivation species. A gate stack is formed on a middle portion of the semiconductor fin. A source or a drain region is formed on a side of the gate stack to form a FinFET.

In accordance with yet other embodiments, a method includes forming a semiconductor fin, and performing a passivation step on a top surface and sidewalls of the semiconductor fin using a passivation species. The passivation species includes a first element and a second element, wherein the first element is more preferred by the top surface of the semiconductor fin than by the sidewalls of the semiconductor fin, and the second element is more preferred by the sidewalls of the semiconductor fin than by the top surface of the semiconductor fin. The method further includes forming a gate stack on a middle portion of the semiconductor fin, and forming a source or a drain region on a side of the gate stack to form a FinFET.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a semiconductor fin comprising a sidewall and a top surface;
   connecting first dangling bonds on the top surface of the semiconductor fin with a first passivation species;
   connecting second dangling bonds on the sidewall of the semiconductor fin with a second passivation species different from the first passivation species; and
   forming a gate stack on the semiconductor fin.

2. The method of claim 1, wherein the first passivation species and the second passivation species are different from major elements of the semiconductor fin.

3. The method of claim 1, wherein the first passivation species is connected to the first dangling bonds through a gas phase, wherein during the gas phase, the top surface of the semiconductor fin is exposed to a process gas comprising the first passivation species.

4. The method of claim 1, wherein the connecting the first dangling bonds and the connecting the second dangling bonds are performed simultaneously, with each of the top surface and the sidewall of the semiconductor fin exposed to both the first passivation species and the second passivation species.

5. The method of claim 1, wherein the connecting the first dangling bonds is performed when isolation regions are in contact with the sidewall, and the method further comprises recessing the isolation regions before the second dangling bonds are connected to the second passivation species.

6. The method of claim 1, wherein the first passivation species is selected from the group consisting essentially of sulfur, selenium, and combinations thereof.

7. The method of claim 1, wherein the second passivation species is selected from the group consisting essentially of antimony, sulfur, arsenic, and combinations thereof.

8. A method comprising:
   exposing a surface of a semiconductor region, wherein the semiconductor region is in an isolation region, and the isolation region contacts sidewalls of the semiconductor region, and wherein the surface of the semiconductor region is coplanar with a top surface of the isolation region;
   depositing a first passivation species onto the surface of the semiconductor region, wherein the first passivation species is different from major elements in the semiconductor region;
   performing an anneal to terminate first dangling bonds on the surface of the semiconductor region with the first passivation species;
   etching the isolation region to expose the sidewalls of the semiconductor region;
   performing a passivation process to terminate second dangling bonds on the sidewalls of the semiconductor region with a second passivation species; and
   forming a gate stack on the surface of the semiconductor region.

9. The method of claim 8, wherein the anneal is performed at a temperature between about 400° C. and about 1,300° C.

10. The method of claim 8, wherein the first passivation species is different from the second passivation species.

11. The method of claim 8 further comprising connecting third dangling bonds on a corner surface of the semiconductor region with a third passivation species different from the second passivation species.

12. The method of claim 8, wherein the first passivation species is selected from the group consisting essentially of sulfur, selenium, and combinations thereof.

13. The method of claim 8, wherein the second passivation species is selected from the group consisting essentially of chlorine, arsenic, and combinations thereof.

14. The method of claim 8, wherein the depositing the first passivation species comprises implanting the first passivation species.

15. A method comprising:
   terminating first dangling bonds on a top surface of a semiconductor region with a first passivation species;
   recessing isolation regions on opposite sides of the semiconductor region, wherein a top portion of the semiconductor region higher than top surfaces of remaining portions of the isolation regions forms a semiconductor fin;
   terminating second dangling bonds on a sidewall of the semiconductor fin with a second passivation species; and
   forming a gate stack on the semiconductor fin.

16. The method of claim 15, wherein the second passivation species is different from the first passivation species.

17. The method of claim 15 further comprising:
   forming a dummy gate stack to cover a middle portion of the semiconductor fin;
   forming an Inter-Layer Dielectric (ILD) to cover end portions of the semiconductor fin; and
   removing the dummy gate stack to form a recess in the ILD, wherein the middle portion of the semiconductor fin is exposed through the recess, and the first dangling bonds and the second dangling bonds are terminated through the recess.

18. The method of claim 15, wherein the first dangling bonds and the second dangling bonds are terminated in a same passivation process.

19. The method of claim 15, wherein the first dangling bonds and the second dangling bonds are terminated in different passivation processes.

20. The method of claim 15 further comprising terminating third dangling bonds on a corner surface of the semiconductor fin with a third passivation species, wherein the corner surface joins the sidewall to the top surface, and the third passivation species is different from one of the first passivation species and the second passivation species.

* * * * *

UNITED STATES PATENT AND TRADEMARK OFFICE
CERTIFICATE OF CORRECTION

PATENT NO. : 10,032,889 B2
APPLICATION NO. : 15/228147
DATED : July 24, 2018
INVENTOR(S) : Clement Hsingjen Wann It is certified that error appears in the above-identified patent and that said Letters Patent is hereby corrected as shown below:

In the Drawings

Please replace sheet 10 with the attached sheet 10.

Signed and Sealed this
Eleventh Day of December, 2018

Andrei Iancu
*Director of the United States Patent and Trademark Office*